(12) United States Patent
Jang et al.

(10) Patent No.: US 6,242,356 B1
(45) Date of Patent: Jun. 5, 2001

(54) ETCHBACK METHOD FOR FORMING MICROELECTRONIC LAYER WITH ENHANCED SURFACE SMOOTHNESS

(75) Inventors: Syun-Ming Jang, Hsin-Chu; Chung-Long Chang, Yun-Lin County; Shwangming Jeng; Chen-Hua Yu, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/465,230

(22) Filed: Dec. 17, 1999

(51) Int. Cl.$^7$ .................................................. H01L 21/311
(52) U.S. Cl. ........................... 438/699; 438/689; 438/692; 438/694; 438/695; 438/697; 438/699; 257/408; 257/213; 216/59; 216/61; 216/84; 216/86
(58) Field of Search .............................. 438/699, 689–97, 438/759, 758, 760; 257/408, 213; 216/59, 61, 84, 86

(56) References Cited

U.S. PATENT DOCUMENTS

| | | | |
|---|---|---|---|
| 4,515,652 | * 5/1985 | Gimpelson et al. | 156/643 |
| 5,532,178 | 7/1996 | Liaw et al. | 437/57 |
| 5,552,346 | * 9/1996 | Huang et al. | 437/228 |
| 5,716,860 | 2/1998 | Huang | 437/34 |
| 5,783,850 | 7/1998 | Liau et al. | 257/355 |
| 5,869,396 | * 2/1999 | Pan et al. | 438/647 |

* cited by examiner

*Primary Examiner*—Matthew Smith
*Assistant Examiner*—Granvill Lee
(74) *Attorney, Agent, or Firm*—George O. Saile; Stephen B. Ackerman; Stephen G. Stanton

(57) ABSTRACT

A method for forming a microelectronic layer within a microelectronic fabrication first employs a substrate. There is then formed over the substrate a target microelectronic layer. There is then formed upon the target microelectronic layer a sacrificial smoothing layer. Finally, there is then etched the sacrificial smoothing layer completely from the target microelectronic layer while partially etching the target microelectronic layer to form a partially etched target microelectronic layer with an enhanced surface smoothness in comparison with the target microelectronic layer.

38 Claims, 2 Drawing Sheets

ETCHBACK METHOD FOR FORMING MICROELECTRONIC LAYER WITH ENHANCED SURFACE SMOOTHNESS

BACKGROUND OF THE INVENTION

1. Field of the Invention

The present invention relates generally to methods for forming microelectronics layers within microelectronic fabrications. More particularly, the present invention relates to methods for forming with enhanced surface smoothness microelectronics layers within microelectronic fabrications.

2. Description of the Related Art

Microelectronic fabrications are formed from microelectronic substrates over which are formed patterned microelectronic conductor layers which are separated by microelectronic dielectric layers. As microelectronic fabrication integration levels have increased and microelectronic device and patterned microelectronic conductor layer dimensions have decreased, it has become more important to form within microelectronic fabrications microelectronic layers, and in particular patterned microelectronic conductor layers, with enhanced surface smoothness. Enhanced surface smoothness of microelectronic layers within microelectronic fabrications, and in particular enhanced surface smoothness of patterned microelectronic conductor layers within microelectronic fabrications, is desirable within the art of microelectronic fabrication, since enhanced surface smoothness of microelectronic layers, and in particular enhanced surface smoothness of patterned microelectronic conductor layers, typically yields, among other advantages, microelectronic fabrications with correspondingly enhanced levels of functionality and/or reliability.

Within the context of the present invention, microelectronic layers with enhanced surface smoothness are intended as microelectronic layers having a peak-to-valley surface topography of less than about 750 angstroms, more preferably less than about 350 angstroms. Peak-to-valley surface topography may typically be measured employing atomic force microscopy (AFM) methods as are known in the art of microelectronic fabrication.

While it is thus desirable within the art of microelectronic fabrication to provide microelectronic layers with enhanced surface smoothness, microelectronic layers with enhanced surface smoothness are nonetheless not entirely readily inherently formed within microelectronic fabrications.

It is thus towards the goal of forming within microelectronic fabrications microelectronic layers with enhanced surface smoothness that the present invention is directed.

Various methods have been disclosed within the art of microelectronic fabrication for forming within microelectronic fabrications microelectronic fabrication layers and microelectronic fabrication structures with desirable properties.

For example, Liau et al., in U.S. Pat. No. 5,532,178 and U.S. Pat. No. 5,783,850, disclose an integrated circuit microelectronic fabrication structure fabricated within an integrated circuit microelectronic fabrication, and a method for fabricating the integrated circuit microelectronic fabrication structure fabricated within the integrated circuit microelectronic fabrication, where the integrated circuit microelectronic fabrication structure incorporates an integrated circuit device which provides for enhanced electrostatic discharge (ESD) resistance of the integrated circuit microelectronic fabrication. The integrated circuit microelectronic fabrication structure comprises an N metal oxide semiconductor field effect transistor (N-MOSFET) which includes an undoped polysilicon gate electrode within the N metal oxide semiconductor field effect transistor (N-MOSFET).

In addition, Huang, in U.S. Pat. No. 5,716,860, also discloses a method for fabricating an integrated circuit microelectronic fabrication structure fabricated within an integrated circuit microelectronic fabrication, where the integrated circuit microelectronic fabrication structure incorporates an integrated circuit device which provides for enhanced electrostatic discharge (ESD) resistance of the integrated circuit microelectronic fabrication. Analogously with that which is disclosed by Liau et al., the integrated circuit microelectronic fabrication structure comprises an N metal oxide semiconductor field effect transistor (N-MOSFET), where although the N metal oxide semiconductor field effect transistor (N-MOSFET) is fabricated with a conductive (i.e. doped) polysilicon gate electrode within the N metal oxide semiconductor field effect transistor (N-MOSFET), the conductive polysilicon gate electrode is separated from a conductive polysilicon contact layer to the conductive polysilicon gate electrode by a undoped polysilicon resistive element.

Desirable within the art of microelectronic fabrication are additional methods and materials which may be employed for forming within microelectronic fabrications microelectronic layers with enhanced surface smoothness.

It is towards the foregoing object that the present invention is directed.

SUMMARY OF THE INVENTION

A first object of the present invention is to provide a method for forming a microelectronic layer within a microelectronic fabrication.

A second object of the present invention is to provide a method in accord with the first object of the present invention, where the microelectronic layer is formed with enhanced surface smoothness.

A third object of the present invention is to provide a method in accord with the first object of the present invention and the second object of the present invention, which method is readily commercially implemented.

In accord with the objects of the present invention, there is provided by the present invention a method for forming a microelectronic layer within a microelectronic fabrication. To practice the method of the present invention, there is first provided a substrate. There is then formed over the substrate a target microelectronic layer. There is then formed upon the target microelectronic layer a sacrificial smoothing layer. Finally, there is then etched the sacrificial smoothing layer completely from the target microelectronic layer while partially etching the target microelectronic layer to form a partially etched target microelectronic layer with an enhanced surface smoothness in comparison with the target microelectronic layer.

There is provided by the present invention a method for forming a microelectronic layer within a microelectronic fabrication, where the microelectronic layer is formed with enhanced surface smoothness. The present invention realizes the foregoing object by forming upon a target microelectronic layer from which is formed the microelectronic layer with the enhanced surface smoothness a sacrificial smoothing layer. There is then etched the sacrificial smoothing layer completely from the target microelectronic layer while partially etching the target microelectronic layer to form a partially etched target microelectronic layer with the enhanced surface smoothness in comparison with the target microelectronic layer.

The method of the present invention is readily commercially implemented. The present invention employs methods and materials as are otherwise generally known within, or readily adapted to, the art of microelectronic fabrication. Since it is a novel use and/or ordering of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

There is provided by the present invention a method for forming a microelectronic layer within a microelectronic fabrication, where the microelectronic layer is formed with enhanced surface smoothness. The present invention realizes the foregoing object by forming upon a target microelectronic layer from which is formed the microelectronic layer with the enhanced surface smoothness a sacrificial smoothing layer. There is then etched the sacrificial smoothing layer completely from the target microelectronic layer while partially etching the target microelectronic layer to form a partially etched target microelectronic layer with the enhanced surface smoothness in comparison with the target microelectronic layer.

The method of the present invention may be employed for forming with enhanced surface smoothness microelectronic layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, the method of the present invention may be employed for forming with enhanced surface smoothness within microelectronic fabrications microelectronic layers including but not limited to microelectronic conductor layers, microelectronic semiconductor layers and microelectronic dielectric layers.

First Preferred Embodiment

Figure 1:
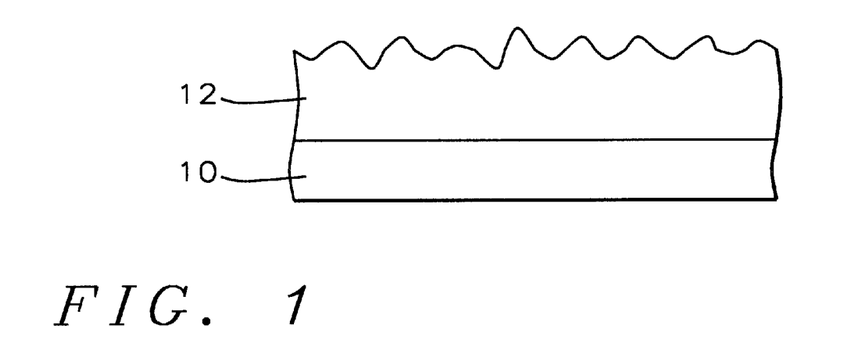
FIG. 1, FIG. 2 and FIG. 3 show a series of schematic cross-sectional diagrams illustrating the results of forming within a microelectronic fabrication in accord with a general embodiment of the present invention which comprises a first preferred embodiment of the present invention, a microelectronic layer with enhanced surface smoothness.
Figure 2:
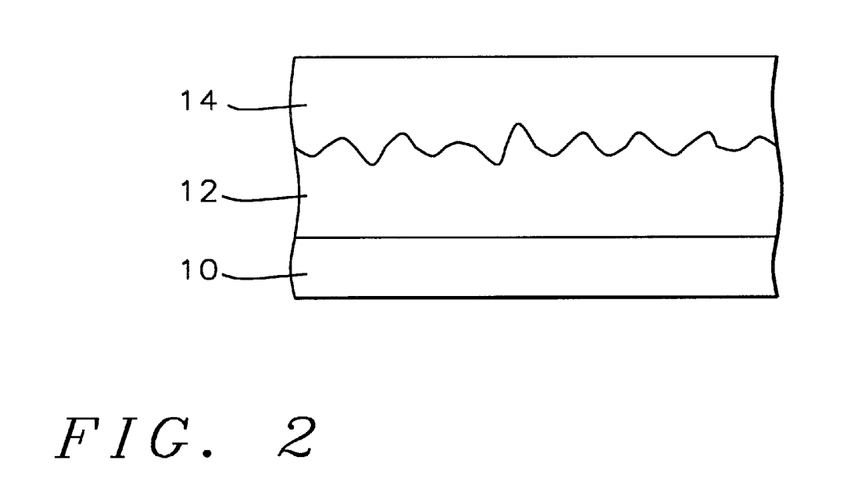
Figure 3:
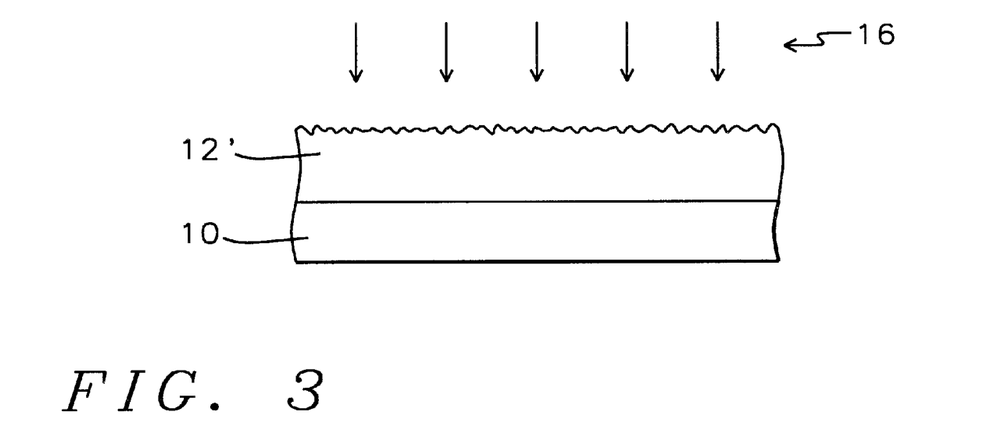

Referring now to FIG. 1 to FIG. 3, there is shown a series of schematic cross-sectional diagrams illustrating the results of forming within a microelectronic fabrication in accord with a general embodiment of the present invention which comprises a first preferred embodiment of the present invention a microelectronic layer with enhanced surface smoothness. Shown in FIG. 1 is a schematic cross-sectional diagram of the microelectronic fabrication at an early stage in its fabrication in accord with the present invention.

Shown in FIG. 1 is a substrate 10 having formed thereupon a microelectronic layer 12. Within the first preferred embodiment of the present invention, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be a substrate alone as employed within the microelectronic fabrication, or in the alternative, the substrate 10 may be the substrate as employed within the microelectronic fabrication, where the substrate has formed thereupon and/or thereover, and thus incorporated therein, any of several additional microelectronic layers as are conventional within the microelectronic fabrication within which is employed the substrate 10. Such additional microelectronic layers may include, but are not limited to microelectronic conductor layers, microelectronic semiconductor layers and microelectronic dielectric layers.

Similarly, although also not specifically illustrated within the schematic cross-sectional diagram of FIG. 1, the substrate 10, particularly when the substrate 10 comprises a semiconductor substrate employed within a semiconductor integrated circuit microelectronic fabrication, will typically and preferably have formed therein and/or thereupon microelectronic devices as are conventional within the microelectronics fabrication within which is employed the substrate 10. Such microelectronic devices may include, but are not limited to resistors, transistors, diodes and capacitors.

Within the first preferred embodiment of the present invention with respect to the blanket target layer 12, it is the blanket target layer 12 whose surface it is desired to smooth while employing the method of the present invention. As is illustrated within the schematic cross-sectional diagram of FIG. 1, the exposed surface of the blanket target layer 12 is formed with enhanced surface roughness, typically greater than about 250 angstroms, peak-to-valley, more typically on the order of about 250 to about 500 angstroms, peak-to-valley. The blanket target layer 12 may be formed from any of several microelectronic materials as are conventional in the art of microelectronic fabrication, including but not limited to microelectronic conductor materials, microelectronic semiconductor materials and microelectronic dielectric materials. Typically and preferably, the blanket target layer 12 is formed to a thickness of from about 1600 to about 2500 angstroms.

Referring now to FIG. 2, there is shown a schematic cross-sectional diagram illustrating the results of further processing of the microelectronic fabrication whose schematic cross-sectional diagram is illustrated in FIG. 1. Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the blanket target layer 12 a blanket sacrificial smoothing layer 14.

Although the blanket sacrificial smoothing layer 14 as illustrated within the schematic cross-sectional diagram of FIG. 1 may be formed from microelectronic materials including but not limited to microelectronic conductor materials, microelectronic semiconductor materials and microelectronic dielectric materials formed employing methods including but not limited to thermal chemical vapor deposition (CVD) methods, plasma enhanced chemical vapor deposition (PECVD) methods and physical vapor deposition (PVD) sputtering methods, for the preferred embodiment of the present invention, the blanket sacrificial smoothing layer 14 is more preferably formed of a gap filling silicon oxide dielectric material deposited employing a subatmospheric pressure thermal chemical vapor deposition (SACVD) method employing tetraethylorthosilicate (TEOS) as a silicon source material and ozone as an oxidant source material, although the method of the present invention will also provide acceptable results when the blanket sacrificial smoothing layer 14 is formed of other gap filling or conformal silicon containing dielectric materials, including but not limited to silicon oxide dielectric materials, silicon nitride dielectric materials and silicon oxynitride dielectric materials deposited employing methods including but not limited to atmospheric pressure thermal chemical vapor deposition (APCVD) methods, low pressure thermal chemical vapor deposition (CVD) methods, plasma enhanced chemical vapor deposition (PECVD) methods and physical vapor deposition (PVD) sputtering methods.

When forming the blanket sacrificial smoothing layer 14 upon an eight inch diameter substrate while employing the subatmospheric pressure thermal chemical vapor deposition (SACVD) method employing tetraethylorthosilicate (TEOS) as the silicon source material and ozone as the oxidant source material, the subatmospheric pressure thermal chemical vapor deposition (SACVD) method also employs: (1) a reactor chamber pressure of from about 400 to about 500 torr; (2) a substrate 10 temperature of from about 350 to about 450 degrees centigrade; (3) a tetraethylorthosilicate concentration of from about 2000 to about 3000 milligrams per cubic meter (mgm) in a helium carrier gas flow of from about 2000 to about 3000 standard cubic centimeters per minute (sccm); and (4) an ozone concentration typically of several percent in an oxygen carrier gas flow of from about 4500 to about 5500 standard cubic centimeters per minute (sccm). Within the first preferred embodiment of the present invention, the blanket sacrificial smoothing layer 14 is typically and preferably formed to a thickness of from about 200 to about 500 angstroms upon the blanket target layer 12. Similarly, typically and preferably, the blanket sacrificial smoothing layer 14 will have an enhanced surface smoothness, typically in a range of from about 200 to about 350 angstroms peak-to-valley, in comparison with the blanket target layer 12.

Referring now to FIG. 3, there is shown a schematic cross-sectional diagram illustrating the results of further processing of the microelectronic fabrication whose schematic cross-sectional diagram is illustrated in FIG. 2. Shown in FIG. 3 is a schematic cross-sectional diagram of a microelectronic fabrication otherwise equivalent to the microelectronic fabrication whose schematic cross-sectional diagram is illustrated in FIG. 2, but wherein: (1) the blanket sacrificial smoothing layer 14 has been completely etched from the microelectronic fabrication; and (2) the blanket target layer 12 has been partially etched to form a partially etched blanket target layer 12', while employing an etchant 16, to provide the partially etched blanket target layer 12' with an enhanced surface smoothness in comparison with the blanket target layer 12.

Within the first preferred embodiment of the present invention, although the etchant 16 may be selected from any of several types of etchants which provide and/or maintain a nominally smooth surface when etching a microelectronic layer, such etchants being selected from the group including but not limited to wet chemical etchants, reactive ion etch (RIE) plasma etchants and inert gas sputter etchants, for the first preferred embodiment of the present invention, the etchant 16 is preferably an inert gas sputter etchant, more preferably an argon inert gas sputter etchant, employed within an inert gas sputter etch method, such as but not limited to a conventional inert gas sputter etch method or a high density plasma inert gas sputter etch method. Typically and preferably, when processing an eight inch diameter substrate 10, the conventional inert gas sputter etch method when employing the argon inert gas sputter etchant also employs: (1) a reactor chamber pressure of from about 0.2 to about 0.6 mtorr; (2) a bias sputtering power of from about 80 to about 300 watts; (3) a substrate 10 temperature of from about 20 to about 30 degrees centigrade; and (4) an argon flow rate of from about 3 to about 10 standard cubic centimeters per minute (sccm). Similarly, when processing an eight inch diameter substrate 10, the high density plasma inert gas sputter etch method when employing the argon inert gas sputter etchant also employs: (1) a reactor chamber pressure of from about 5 to about 10 mtorr; (2) a side radio frequency power of from about 1300 to about 3100 watts and a bottom radio frequency power of from about 500 to about 1000 watts; (3) a substrate 10 temperature of from about 500 to about 600 degrees centigrade; and (4) an argon flow rate of from about 80 to about 140 standard cubic centimeters per minute (sccm).

Upon forming the microelectronic fabrication whose schematic cross-sectional diagram is illustrated within FIG. 3, there is formed a microelectronic fabrication having formed therein a microelectronic layer with enhanced surface smoothness. The method of the present invention realizes the foregoing object by employing when forming the microelectronic layer with enhanced surface smoothness a blanket target layer having a blanket sacrificial smoothing layer formed upon the blanket target layer, where the blanket sacrificial smoothing layer is completely etched from the blanket target layer and the blanket target layer is then partially etched to form a partially etched blanket target layer which has an enhanced surface smoothness in comparison with the blanket target layer.

Although not completely illustrated within the schematic cross-sectional diagrams of FIG. 1 to FIG. 3, within the method of the present invention and the first preferred embodiment of the method of the present invention, it is neither inherent, nor required, nor necessarily desired that the blanket target layer 12 is globally planarized when providing the partially etched blanket target layer 12' with enhanced surface smoothness in accord with the present invention. As will be illustrated in greater detail within the second preferred embodiment of the present invention, the global contours of a blanket target layer may remain unchanged while a surface smoothness of the blanket target layer is enhanced while employing the present invention. To avoid global planarization and/or blanket sacrificial smoothing layer residue formation, it is desirable within the present invention that global contours of a blanket target layer not have an angle of elevation of greater than about 120 degrees with respect to the plane of a substrate over which is formed the blanket target layer.

Second Preferred Embodiment

Figure 4:
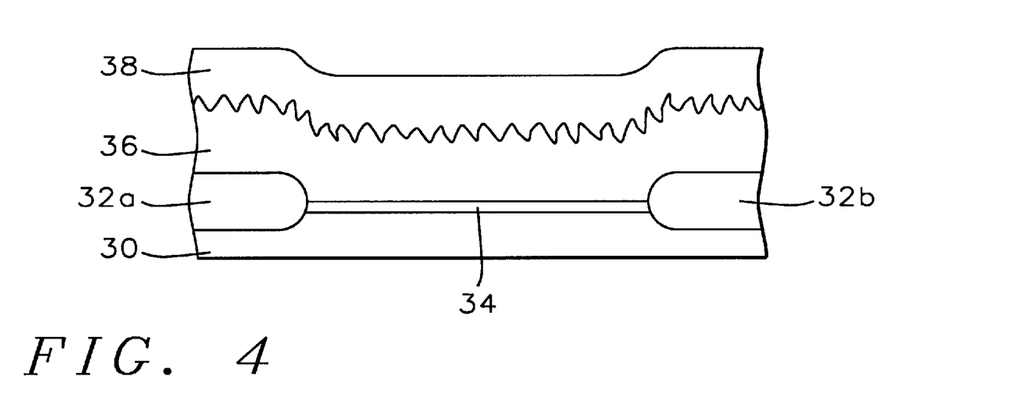
FIG. 4, FIG. 5 and FIG. 6 show a series of schematic cross-sectional diagrams illustrating the results of forming within a field effect transistor (FET) within a semiconductor integrated circuit microelectronic fabrication in accord with a more specific embodiment of the present invention which comprises a second preferred embodiment of the present invention a gate electrode with enhanced surface smoothness.
Figure 5:
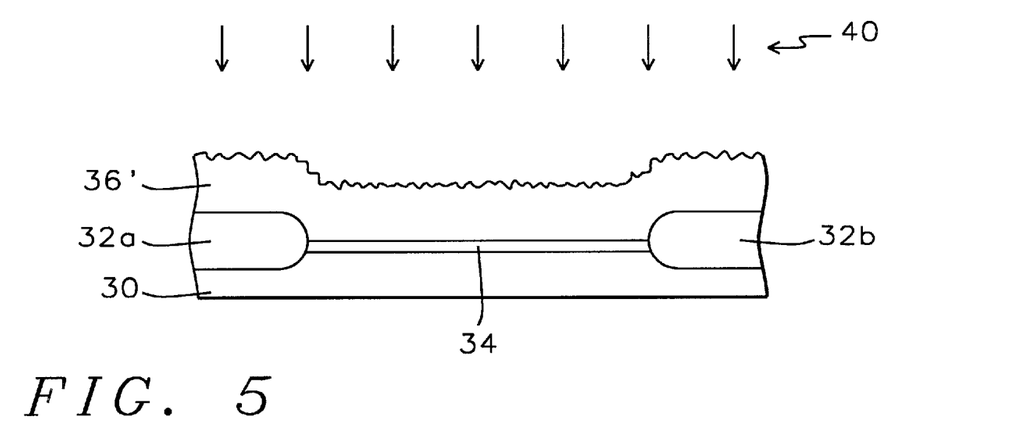
Figure 6:
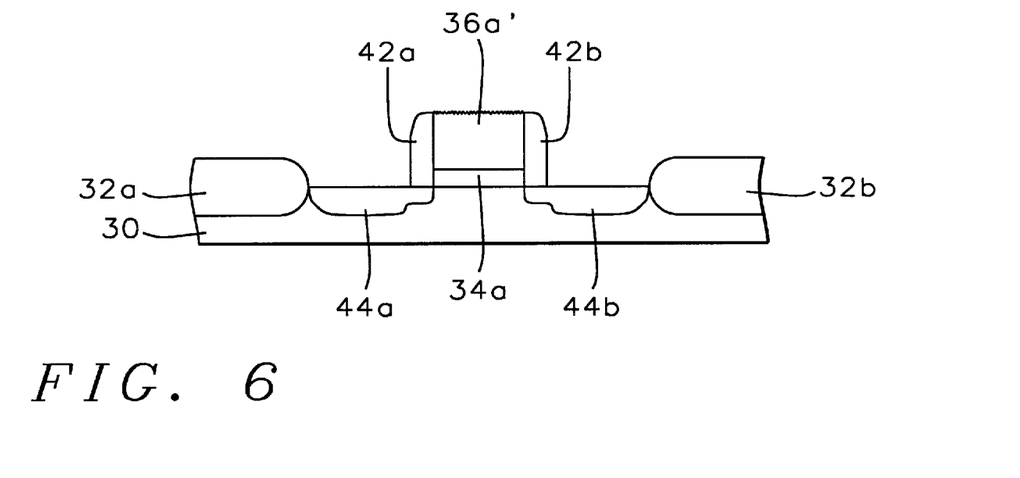

Referring now to FIG. 4 to FIG. 6, there is shown a series of schematic cross-sectional diagrams illustrating the results of forming within a field effect transistor (FET) within a semiconductor integrated circuit microelectronic fabrication in accord with a more specific embodiment of the present invention which comprises a second preferred embodiment of the present invention a gate electrode with enhanced surface smoothness. Shown in FIG. 4 is a schematic cross-sectional diagram of the semiconductor integrated circuit microelectronic fabrication at an early stage in its fabrication in accord with the second preferred embodiment of the present invention.

Shown in FIG. 4 is a semiconductor substrate 30 having formed within and upon its surface a pair of isolation regions 32a and 32b which define an active region of the semiconductor substrate 30. Although it is known in the art of semiconductor integrated circuit microelectronic fabrication that semiconductor substrates are available with either dopant polarity, several dopant concentrations and various crystallographic orientations, for the second preferred embodiment of the present invention, the semiconductor substrate 30 is typically and preferably a (100) silicon semiconductor substrate having an N- or P-doping.

Similarly, although it is also known in the art of semiconductor integrated circuit microelectronic fabrication that isolation regions may be formed within silicon semiconductor substrates to define active regions of those silicon semiconductor substrates while employing methods including but not limited to isolation region thermal growth methods and isolation region deposition/patterning methods, for the second preferred embodiment of the present invention, the isolation regions 32a and 32b are preferably formed within and upon the semiconductor substrate 30 to define the active region of the semiconductor substrate 30 while employing an isolation region thermal growth method at a temperature of from about 700 to about 1000 degrees centigrade to form the isolation regions 32a and 32b of silicon oxide within and upon the semiconductor substrate 30.

Shown also within FIG. 4 formed upon the active region of the semiconductor substrate 30 defined by the pair of isolation regions 32a and 32b is a blanket gate dielectric layer 34. Although it is known in the art of semiconductor integrated circuit microelectronic fabrication that blanket gate dielectric layers may be formed upon semiconductor substrates while employing methods including but not limited to blanket gate dielectric layer thermal growth methods and blanket gate dielectric layer deposition/patterning methods, for the second preferred embodiment of the present invention, the blanket gate dielectric layer 34 is typically and preferably formed employing a blanket gate dielectric layer thermal growth method at a temperature of from about 800 to about 1100 degrees centigrade to form the blanket gate dielectric layer 34 of silicon oxide of thickness about 15 to about 75 angstroms upon the active region of the semiconductor substrate 30.

There is also shown within the schematic cross-sectional diagram of FIG. 4 a blanket polysilicon layer 36 formed contiguously spanning upon the isolation regions 32a and 32b and the blanket gate dielectric layer 34. Within the second preferred embodiment of the present invention, the blanket polysilicon layer 36 may be formed employing methods and materials as are conventional in the art of semiconductor integrated circuit microelectronic fabrication, such methods including but not limited to thermal chemical vapor deposition (CVD) methods, plasma enhanced chemical vapor deposition (PECVD) methods and physical vapor deposition (PVD) sputtering methods. As is illustrated within the schematic cross-sectional diagram of FIG. 4, the blanket polysilicon layer 36 is formed with an enhanced surface roughness, analogously with the blanket target layer 12 within the first preferred embodiment of the present invention as illustrated within the schematic cross-sectional diagram of FIG. 1. Similarly within the blanket target layer 12 as illustrated within the schematic cross-sectional diagram of FIG. 1, the blanket polysilicon layer 36 will typically have a peak-to-peak surface roughness of from about 250 to about 500 angstroms.

Although not specifically illustrated within the schematic cross-sectional diagram of FIG. 4, at least a portion of the blanket polysilicon layer 36 is preferably formed of an undoped polysilicon material, and under certain circumstances the entirety of the blanket polysilicon layer 36 is desirably formed of the undoped polysilicon material. Alternatively, appropriate dopants may be incorporated when forming selected layered portions of the blanket polysilicon layer 36. Within the second preferred embodiment of the present invention, the blanket polysilicon layer 36 is more preferably formed employing a low pressure thermal chemical vapor deposition (LPCVD) method employing silane as a silicon source material. The low pressure thermal chemical vapor deposition (LPCVD) method also employs, when forming the blanket polysilicon layer 36 upon an eight inch diameter semiconductor substrate 30: (1) a reactor chamber pressure of from about 10 to about 20 pascal; (2) a semiconductor substrate 30 temperature of from about 600 to about 800 degrees centigrade; and (3) a silane flow of from about 300 to about 500 standard cubic centimeters per minute (sccm). Typically and preferably, the blanket polysilicon layer 36 is formed to a thickness of from about 1600 to about 2500 angstroms.

Finally, there is shown within the schematic cross-sectional diagram of FIG. 4a blanket sacrificial smoothing layer 38 formed upon the blanket polysilicon layer 36. Within the second preferred embodiment of the present invention, the blanket sacrificial smoothing layer 38 is typically and preferably formed employing methods, materials and dimensions analogous or equivalent to the methods, materials and dimensions employed for forming the blanket sacrificial smoothing layer 14 within the first preferred embodiment of the present invention as illustrated within the schematic cross-sectional diagram of FIG. 2.

Referring now to FIG. 5, there is shown a schematic cross-sectional diagram illustrating the results of further processing of the microelectronic fabrication whose schematic cross-sectional diagram is illustrated in FIG. 4. Shown in FIG. 5 is a schematic cross-sectional diagram of a microelectronic fabrication otherwise equivalent to the microelectronic fabrication whose schematic cross-sectional diagram is illustrated in FIG. 4, but wherein: (1) the blanket sacrificial smoothing layer 38 has been completely etched from the blanket polysilicon layer 36; and (2) the blanket polysilicon layer 36 has been partially etched to form a partially etched blanket polysilicon layer 36', within an etchant 40.

Within the second preferred embodiment of the present invention, the etchant 40 is typically and preferably provided employing methods, materials and process limitations analogous or equivalent to the methods, materials and process limitations employed for providing the etchant 16 within the first preferred embodiment of the present invention as illustrated within the schematic cross-sectional diagram of FIG. 3. Thus, analogously with the first preferred embodiment of the present invention, within the second preferred embodiment of the present invention the partially etched blanket polysilicon layer 36' has an enhanced surface smoothness in comparison with the blanket polysilicon layer 36. Such an enhanced surface smoothness of the partially etched blanket polysilicon layer 36' is desirable within the second preferred embodiment of the present invention, since it provides for enhanced critical dimension (CD) control, more homogeneous surface etch characteristics and more homogeneous silicidation characteristics when further processing the partially etched blanket polysilicon layer 36' as illustrated within the schematic cross-sectional diagram of FIG. 5.

Referring now to FIG. 6, there is shown a schematic cross-sectional diagram illustrating the results of further processing of the microelectronics fabrication whose schematic cross-sectional diagram is illustrated in FIG. 5. Shown in FIG. 6 is a schematic cross-sectional diagram of a microelectronic fabrication otherwise equivalent to the microelectronic fabrication whose schematic cross-sectional diagram is illustrated in FIG. 5, but wherein, in a first instance, the partially etched blanket polysilicon layer 36' and the blanket gate dielectric layer 34 have been sequentially completely patterned to form a corresponding polysilicon gate electrode 36a' and a corresponding patterned gate dielectric layer 34a. The partially etched blanket polysilicon layer 36' and the blanket gate dielectric layer 34 may be completely patterned to form the corresponding polysilicon gate electrode 36a' and the corresponding patterned gate dielectric layer 34a while employing methods as are conventional in the art of microelectronic fabrication, which methods will typically, but not exclusively, include reactive ion etch (RIE) plasma etch methods which employ: (1) a chlorine containing etchant gas composition for patterning the partially etched blanket polysilicon layer 36' when forming the polysilicon gate electrode 36a'; and (2) a fluorine containing etchant gas composition when patterning the blanket gate dielectric layer 34 when forming the patterned gate dielectric layer 34a.

There is also shown within the schematic cross-sectional diagram of FIG. 6 a pair of dielectric spacer layers 42a and 42b formed adjoining a pair of opposite edges of the polysilicon gate electrode 36a' and the patterned gate dielectric layer 34a. As is known in the art of semiconductor integrated circuit microelectronic fabrication, such dielectric spacer layers may be formed employing an anisotropic etching of a blanket conformal dielectric layer formed upon the semiconductor integrated circuit microelectronic fabrication whose schematic cross-sectional diagram is illustrated in FIG. 6 absent the pair of dielectric spacer layers 42a and 42b. Thus, the dielectric spacer layers 42a and 42b may be formed of dielectric materials including but not limited to silicon oxide dielectric materials, silicon nitride dielectric materials and silicon oxynitride dielectric materials.

Finally, there is shown within FIG. 6 formed within the active region of the semiconductor substrate 30 at areas not covered by the patterned gate dielectric layer 34a and the polysilicon gate electrode 36a' a pair of source/drain regions 44a and 44b which incorporate a pair of lightly doped drain (LDD) structures extending beneath the pair of dielectric spacer layers 42a and 42b. As is conventional in the art of semiconductor integrated circuit microelectronic fabrication, the pair of source/drain regions 44a and 44b incorporating the pair of lightly doped drain (LDD) structures is formed employing: (1) a low dose ion implant at an ion implant dose of from about 1E12 to about 1E13 ions per square centimeter and an ion implantation energy of from about 25 to about 130 kev while employing the patterned gate dielectric layer 34a and the polysilicon gate electrode 36a' as a mask; followed by (2) a high dose ion implant at an ion implant dose of from about 1E13 to about 1E15 ions per square centimeter and an ion implantation energy of from about 3 to about 5 kev while employing the patterned gate dielectric layer 34a, the polysilicon gate electrode 36a' and the pair of dielectric spacer layers 42a and 42b as a mask.

Upon forming the semiconductor integrated circuit microelectronic fabrication whose schematic cross-sectional diagram is illustrated in FIG. 6, there is formed a semiconductor integrated circuit microelectronic fabrication having formed therein a field effect transistor (FET) wherein a polysilicon gate electrode within the field effect transistor (FET) has an enhanced surface smoothness. The polysilicon gate electrode has the enhanced surface smoothness since there is employed within the second preferred embodiment of the present invention when forming the polysilicon gate electrode a blanket polysilicon layer with an enhanced surface roughness, where the blanket polysilicon layer with the enhanced surface roughness has formed thereupon a blanket sacrificial smoothing layer which is subsequently completely etched from the blanket polysilicon layer while partially etching the blanket polysilicon layer to form a partially etched blanket polysilicon layer which has an enhanced surface smoothness in comparison with the blanket polysilicon layer.

EXAMPLE

There was obtained two eight inch diameter (100) silicon semiconductor substrate and formed upon each eight inch diameter (100) silicon semiconductor substrate was a blanket undoped polysilicon layer formed employing a low pressure thermal chemical vapor deposition (LPCVD) method which employed silane as a silicon source material. The low pressure thermal chemical vapor deposition (LPCVD) method also employed: (1) a reactor chamber pressure of about 15 pascal; (2) a semiconductor substrate temperature of about 620 degrees centigrade; (3) a silane flow of about 400 standard cubic centimeters per minute (sccm). The blanket undoped polysilicon layers were each formed to a thickness of about 2000 angstroms upon a corresponding semiconductor substrate. A surface roughness of the blanket undoped polysilicon layers was then measured employing an atomic force microscopy (AFM) method as is conventional in the art of microelectronic fabrication.

There was then formed upon each blanket undoped polysilicon layer a blanket sacrificial smoothing layer formed of a silicon oxide dielectric material formed employing a subatmospheric pressure thermal chemical vapor deposition (SACVD) method employing tetraethylorthosilicate (TEOS) as a silicon source material and ozone as an oxidant source material. The subatmospheric pressure thermal chemical vapor deposition (SACVD) method also employed: (1) a reactor chamber pressure of about 450 torr; (2) a semiconductor substrate temperature of about 400 degrees centigrade; (3) a tetraethylorthosilicate (TEOS) concentration rate of about 2300 milligrams per cubic meter (mgm) in a helium carrier gas flow of about 2800 standard cubic centimeters per minute (sccm); and (4) an ozone oxidant concentration of about several weight percent in an oxygen carrier gas flow of about 5000 standard cubic centimeters per minute (sccm). One of the blanket sacrificial smoothing layers was formed upon a blanket undoped polysilicon layer to a thickness of about 300 angstroms, while the other blanket sacrificial smoothing layer was formed upon the other blanket undoped polysilicon layer to a thickness of about 500 angstroms.

The blanket sacrificial smoothing layers were then etched from the blanket undoped polysilicon layers and the blanket undoped polysilicon layers were also partially etched while employing a high density plasma inert gas sputter etch method employing an argon inert sputter gas. The high density plasma inert gas sputter etch method also employed: (1) a reactor chamber pressure of about 5 mtorr; (2) a bias sputtering power of about 2200 watts; (3) a semiconductor substrate temperature of about 500 degrees centigrade; and (4) an argon flow rate of about 105 standard cubic centimeters per minute (sccm). Subsequently to completely etching the blanket sacrificial smoothing layers from the blanket undoped polysilicon layers, the blanket undoped polysilicon layers were etched until there was removed about 350 angstroms of each of the blanket undoped polysilicon layers to form a corresponding pair of partially etched blanket undoped polysilicon layers.

The surface roughnesses of the partially etched blanket undoped polysilicon layers were then measured employing the same atomic force microscopy (AFM) method as was employed for measuring the surface roughnesses of the blanket undoped polysilicon layers. The measured values of the surface roughness of the blanket undoped polysilicon layers and the partially etched blanket undoped polysilicon layer are reported in Table I.

TABLE I

| | Surface Roughness Peak-to-Valley (angstroms) |
|---|---|
| Blanket Polysilicon Layer as Deposited | 250 +/− 100 |
| Partial Etched Polysilicon - 500 A O3/TEOS | 130 +/− 30 |
| Partial Etched Polysilicon - 1000 A O3/TEOS | 120 +/− 30 |

As is seen from review of the data within Table I, there is provided in accord with the method of the present invention partially etched blanket undoped polysilicon layers with enhanced surface smoothness in comparison with a blanket undoped polysilicon layer from which they are formed.

As is understood by a person skilled in the art, the preferred embodiments and examples of the present invention are illustrative of the present invention rather than limiting of the present invention. Revisions and modifications may be made to methods, materials, structures and dimensions through which is provided a microelectronic layer with enhanced surface smoothness in accord with the preferred embodiments and examples of the present invention while still providing microelectronic layers with enhanced surface smoothness in accord with the present invention, as defined by the accompanying claims.

What is claimed is:

1. A method for forming a polysilicon layer within a microelectronic fabrication comprising:
   providing a substrate;
   forming over the substrate a polysilicon layer;
   forming upon the polysilicon layer a sacrificial smoothing layer; and
   etching the sacrificial smoothing layer completely from the polysilicon layer while partially etching the polysilicon layer to form a partially etched polysilicon layer with an enhanced surface smoothness in comparison with the polysilicon layer.

2. The method of claim 1 wherein the polysilicon layer is formed to a thickness of from about 1600 to about 2500 angstroms.

3. The method of claim 1 wherein the sacrificial smoothing layer is selected from the group consisting of conformal layers and gap filling layers.

4. The method of claim 1 wherein the sacrificial smoothing layer is formed to a thickness of from about 200 to about 500 angstroms.

5. The method of claim 1 wherein the sacrificial smoothing layer is formed of a silicon oxide dielectric material deposited employing a subatmospheric pressure thermal chemical vapor deposition (SACVD) method.

6. The method of claim 1 wherein the etching of the sacrificial smoothing layer and the polysilicon layer is undertaken employing an etch method selected from the group consisting of wet chemical etch methods, reactive ion etch (RIE) plasma etch methods and inert gas sputter etch methods.

7. The method of claim 1 wherein the polysilicon layer is not globally planarized when etching the polysilicon layer to form the partially etched polysilicon layer with the enhanced surface smoothness in comparison with the polysilicon layer.

8. The method of claim 1, wherein the polysilicon layer is an undoped polysilicon layer having enhanced surface roughness.

9. The method of claim 1, wherein the sacrificial smoothing layer is formed of a material selected from the group consisting of silicon oxide dielectric materials, silicon nitride dielectric materials and silicon oxynitride dielectric materials.

10. The method of claim 1, wherein the sacrificial smoothing layer is formed of a material selected from the group consisting of silicon oxide dielectric materials, silicon nitride dielectric materials and silicon oxynitride dielectric materials deposited employing methods selected from the group consisting of APCVD methods, low pressure thermal CVD methods, PECVD methods and PVD sputtering methods.

11. The method of claim 1, wherein the sacrificial smoothing layer is formed of a silicon oxide dielectric material deposited employing a subatmospheric pressure thermal chemical vapor deposition (SACVD) method, TEOS as the silicon source material, and ozone as the oxidant source material.

12. The method of claim 1, wherein the sacrificial smoothing layer is formed of a silicon oxide dielectric material deposited employing a reactor chamber pressure of from about 400 to about 500 torr; a substrate temperature of from about 350 to 450° C.; a TEOS concentration of from about 2000 to 3000 milligrams per cubic meter in a helium carrier gas flow of from about 2000 to 3000 sccm; and an ozone concentration of several percent in an oxygen carrier gas flow of from about 4500 to 5500 sccm.

13. The method of claim 1, wherein the polysilicon layer is an undoped polysilicon layer having enhanced surface roughness of greater than about 250 Å peak-to-valley.

14. The method of claim 1, wherein the polysilicon layer is an undoped polysilicon layer having enhanced surface roughness of from about 250 to 500 Å peak-to-valley, the sacrificial smoothing layer has an enhanced surface smoothness of from about 200 to 350 Å peak-to-valley, and the partially etched polysilicon layer has an enhanced surface smoothness compared to the surface roughness of the formed polysilicon layer.

15. The method of claim 1, wherein the etching step employs an argon inert gas sputter etchant.

16. The method of claim 1, wherein the etching step is a conventional inert gas sputter etch method employing a reactor chamber pressure of from about 0.2 to 0.6 mTorr; a bias sputtering power of from about 80 to 300 watts; a substrate temperature of from about 20 to 30° C.; and an argon flow rate of from about 3 to 10 sccm when processing an eight inch diameter substrate.

17. The method of claim 1, wherein the etching step is a high density plasma inert gas sputter etch method employing a reactor chamber pressure of from about 5 to 10 mTorr; a side radio frequency power of from about 1300 to 3100 watts; a bottom radio frequency power of from about 500 to 1000 watts; a substrate temperature of from about 500 to 600° C.; and an argon flow rate of from about 80 to 140 sccm when processing an eight inch diameter substrate.

18. A method for forming a polysilicon layer within a microelectronic fabrication comprising:
providing a substrate;
forming over the substrate an undoped polysilicon layer having enhanced surface roughness;
forming upon the polysilicon layer a sacrificial smoothing layer; the sacrificial smoothing layer being formed of a silicon oxide dielectric material; and
etching the sacrificial smoothing layer completely from the polysilicon layer while partially etching the polysilicon layer to form a partially etched polysilicon layer with an enhanced surface smoothness in comparison with the formed polysilicon layer; the etching step employing an inert gas sputter etchant.

19. The method of claim 18, wherein the sacrificial smoothing layer is deposited employing methods selected from the group consisting of APCVD methods, low pressure thermal CVD methods, PECVD methods and PVD sputtering methods.

20. The method of claim 18, wherein the sacrificial smoothing layer is deposited employing a subatmospheric pressure thermal chemical vapor deposition (SACVD) method, TEOS as the silicon source material, and ozone as the oxidant source material.

21. The method of claim 18, wherein the sacrificial smoothing layer is deposited employing a reactor chamber pressure of from about 400 to about 500 torr; a substrate temperature of from about 350 to 450° C.; a TEOS concentration of from about 2000 to 3000 milligrams per cubic meter in a helium carrier gas flow of from about 2000 to 3000 sccm; and an ozone concentration of several percent in an oxygen carrier gas flow of from about 4500 to 5500 sccm.

22. The method of claim 18, wherein the undoped polysilicon layer has an enhanced surface roughness of greater than about 250 Å peak-to-valley.

23. The method of claim 18, wherein the undoped polysilicon layer has an enhanced surface roughness of from about 250 to 500 Å peak-to-valley, the sacrificial smoothing layer has an enhanced surface smoothness of from about 200 to 350 Å peak-to-valley, and the partially etched polysilicon layer has an enhanced surface smoothness compared to the surface roughness of the formed polysilicon layer.

24. The method of claim 18, wherein the etching step is a conventional inert gas sputter etch method employing a reactor chamber pressure of from about 0.2 to 0.6 mTorr; a bias sputtering power of from about 80 to 300 watts; a substrate temperature of from about 20 to 30° C.; and an argon flow rate of from about 3 to 10 sccm when processing an eight inch diameter substrate.

25. The method of claim 18, wherein the etching step is a high density plasma inert gas sputter etch method employing a reactor chamber pressure of from about 5 to 10 mTorr; a side radio frequency power of from about 1300 to 3100 watts; a bottom radio frequency power of from about 500 to 1000 watts; a substrate temperature of from about 500 to 600° C.; and an argon flow rate of from about 80 to 140 sccm when processing an eight inch diameter substrate.

26. The method of claim 18, wherein the undoped polysilicon layer is formed to a thickness of from about 1600 to about 2500 Å.

27. The method of claim 18, wherein the sacrificial smoothing layer is formed to a thickness of from about 200 to about 500 Å.

28. The method of claim 18, wherein the polysilicon layer is not globally planarized when etching the polysilicon layer to form the partially etched polysilicon layer with the enhanced surface smoothness in comparison with the polysilicon layer.

29. A method for forming a polysilicon layer within a microelectronic fabrication comprising:
providing a substrate;
forming over the substrate an undoped polysilicon layer having enhanced surface roughness of greater than about 250 Å peak-to-valley;
forming upon the polysilicon layer a sacrificial smoothing layer; the sacrificial smoothing layer being formed of a silicon oxide dielectric material; and
etching the sacrificial smoothing layer completely from the polysilicon layer while partially etching the polysilicon layer to form a partially etched polysilicon layer with an enhanced surface smoothness in comparison with the formed polysilicon layer; the etching step employing an inert gas sputter etchant.

30. The method of claim 29, wherein the sacrificial smoothing layer is deposited employing methods selected from the group consisting of APCVD methods, low pressure thermal CVD methods, PECVD methods and PVD sputtering methods.

31. The method of claim 29, wherein the sacrificial smoothing layer is deposited employing a subatmospheric pressure thermal chemical vapor deposition (SACVD) method, TEOS as the silicon source material, and ozone as the oxidant source material.

32. The method of claim 29, wherein the sacrificial smoothing layer is deposited employing a reactor chamber pressure of from about 400 to about 500 torr; a substrate temperature of from about 350 to 450° C.; a TEOS concentration of from about 2000 to 3000 milligrams per cubic meter in a helium carrier gas flow of from about 2000 to 3000 sccm; and an ozone concentration of several percent in an oxygen carrier gas flow of from about 4500 to 5500 sccm.

33. The method of claim 29, wherein the undoped polysilicon layer has an enhanced surface roughness of from about 250 to 500 Å peak-to-valley, the sacrificial smoothing layer has an enhanced surface smoothness of from about 200 to 350 Å peak-to-valley, and the partially etched polysilicon layer has an enhanced surface smoothness compared to the surface roughness of the formed polysilicon layer.

34. The method of claim 29, wherein the etching step is a conventional inert gas sputter etch method employing a reactor chamber pressure of from about 0.2 to 0.6 mTorr; a bias sputtering power of from about 80 to 300 watts; a substrate temperature of from about 20 to 30° C.; and an argon flow rate of from about 3 to 10 sccm when processing an eight inch diameter substrate.

35. The method of claim 29, wherein the etching step is a high density plasma inert gas sputter etch method employing a reactor chamber pressure of from about 5 to 10 mTorr; a side radio frequency power of from about 1300 to 3100 watts; a bottom radio frequency power of from about 500 to 1000 watts; a substrate temperature of from about 500 to 600° C.; and an argon flow rate of from about 80 to 140 sccm when processing an eight inch diameter substrate.

36. The method of claim 29, wherein the undoped polysilicon layer is formed to a thickness of from about 1600 to about 2500 Å.

37. The method of claim 29, wherein the sacrificial smoothing layer is formed to a thickness of from about 200 to about 500 Å.

38. The method of claim 29, wherein the polysilicon layer is not globally planarized when etching the polysilicon layer to form the partially etched polysilicon layer with the enhanced surface smoothness in comparison with the polysilicon layer.

* * * * *